(12) United States Patent
Kiyota

(10) Patent No.: US 6,838,803 B2
(45) Date of Patent: Jan. 4, 2005

(54) SYSTEM FOR DETECTING ABRASION OF BRUSH OF DIRECT CURRENT MOTOR

(75) Inventor: Shigeyuki Kiyota, Yokohama (JP)

(73) Assignee: Nissan Motor Co., Ltd., Kanagawa (JP)

( * ) Notice: Subject to any disclaimer, the term of this patent is extended or adjusted under 35 U.S.C. 154(b) by 165 days.

(21) Appl. No.: 10/330,169

(22) Filed: Dec. 30, 2002

(65) Prior Publication Data

US 2003/0126915 A1 Jul. 10, 2003

(30) Foreign Application Priority Data

Jan. 8, 2002 (JP) ........................................ 2002-001259

(51) Int. Cl.⁷ .............................................. H02K 39/38
(52) U.S. Cl. ........................................ 310/242; 310/238
(58) Field of Search ........................ 310/68 R, 238–251

(56) References Cited

U.S. PATENT DOCUMENTS

| | | | | |
|---|---|---|---|---|
| 4,488,078 A | * | 12/1984 | Orton | 310/242 |
| 4,743,787 A | * | 5/1988 | Bunner et al. | 310/242 |
| 4,761,594 A | * | 8/1988 | Rodi et al. | 318/490 |
| 4,918,348 A | * | 4/1990 | Fitzsimmons et al. | 310/242 |
| 5,283,489 A | * | 2/1994 | Ochiai et al. | 310/71 |
| 6,703,755 B2 | * | 3/2004 | Miyamoto et al. | 310/239 |

FOREIGN PATENT DOCUMENTS

| | | |
|---|---|---|
| JP | 57-006301 A | 1/1982 |
| JP | 62-155745 A | 7/1987 |
| JP | 05-304746 | 11/1993 |
| JP | 6-14501 | 1/1994 |
| JP | 07-231508 | 8/1995 |
| JP | 8-308186 | 11/1996 |
| JP | 9-142328 | 6/1997 |
| JP | 9-289757 A | 11/1997 |
| JP | 10-94287 | 4/1998 |
| JP | 11-103561 A | 4/1999 |

* cited by examiner

*Primary Examiner*—Thanh Lam
(74) *Attorney, Agent, or Firm*—McDermott Will & Emery LLP

(57) ABSTRACT

A motor vehicle has road wheels driven by a direct current motor that has a brush installed therein. A system for detecting abrasion of the brush comprises a clutch arranged between the road wheel and the direct current motor. The clutch is of a wet type so that in ON condition thereof, drive and driven members thereof are engaged with each other causing transmission of a torque of the motor to the road wheel and in OFF condition thereof, the drive and driven members thereof are disengaged from each other permitting a certain but small transmission of a torque of the road wheels toward the motor due to a viscosity possessed by oil in the clutch. A rotation speed sensor is provided that detects a rotation speed of the motor. A control unit is provided that issues a brush abrasion representing signal based on the rotation speed of the motor detected under OFF condition of the clutch.

15 Claims, 10 Drawing Sheets

SYSTEM FOR DETECTING ABRASION OF BRUSH OF DIRECT CURRENT MOTOR

BACKGROUND OF INVENTION

1. Field of Invention

The present invention relates in general to detecting systems for detecting operation condition of a direct current motor, and more particularly to detecting systems of a type that detects abrasion of a brush of a direct current motor employed as a power generator in electric vehicles, hybrid type vehicles and the like.

2. Description of Related Art

In order to detect abrasion of a brush of a DC motor, Laid-Open Japanese Patent Application (Tokkaihei) 5-304746 discloses a system that issues an alarm when the brush is worn down by a certain degree. That is, the system comprises a detection contact that is connected to the brush to move therewith. When, due to abrasion of the brush, the detection contact is brought into contact with a receiving contact, an alarm circuit is closed thereby to generate an alarm sound. Thus, the abrasion of the brush is automatically detected and a necessary measure can be adopted in advance. However, due to its inherent construction, the system of the published application has failed to exhibit a satisfied performance.

SUMMARY OF INVENTION

It is an object of the present invention to provide a system for detecting abrasion of a brush of a direct current motor, which can exhibit a satisfied performance irrespective of its simple and lower-cost construction.

According to a first aspect of the present invention, there is provided in a motor vehicle having a road wheel driven by a direct current motor that has a brush installed therein, a system for detecting abrasion of the brush. The system comprises a clutch arranged between the road wheel and the direct current motor, the clutch being of a wet type so that in ON condition drive and driven members thereof are engaged with each other causing transmission of a torque of the motor to the road wheel and in OFF condition the drive and driven members thereof are disengaged from each other permitting a certain transmission of a torque of the road wheel toward the motor due to a viscosity possessed by oil in the clutch; a rotation speed sensor that detects a rotation speed of the motor; and a control unit that issues a brush abrasion representing signal based on the rotation speed of the motor detected under OFF condition of the clutch.

According to a second aspect of the present invention, there is provided, in a motor vehicle having a road wheel driven by a direct current motor that has a brush installed therein, a system for detecting abrasion of the brush. The system comprises clutch means arranged between the road wheel and the direct current motor, the clutch means being of a wet type so that in ON condition drive and driven members thereof are engaged with each other causing a transmission of a torque of the motor to the road wheel and in OFF condition the drive and driven members thereof are disengaged from each other permitting a certain transmission of a torque of the road wheel toward the motor due to a viscosity possessed by oil in the clutch; rotation speed sensor means that detects a rotation speed of the direct current motor; and control means that issues a brush abrasion representing signal based on the rotation speed of the motor detected under OFF condition of the clutch.

According to a third aspect of the present invention, there is provided, in a motor vehicle having a road wheel driven by a direct current motor with a brush installed therein and a clutch arranged between the road wheel and the direct current motor, the clutch being of a wet type so that in ON condition drive and driven members thereof are engaged with each other causing a transmission of a torque of the motor to the road wheel and in OFF condition the drive and driven members thereof are disengaged from each other permitting a certain transmission of a torque of the road wheel toward the motor due to a viscosity possessed by oil in the clutch, method for detecting abrasion of the brush comprising detecting a rotation speed of the motor; and issuing a brush abrasion representing signal based on the detected rotation speed of the motor under OFF condition of the clutch.

DETAILED DESCRIPTION OF EMBODIMENTS

Figure 1:
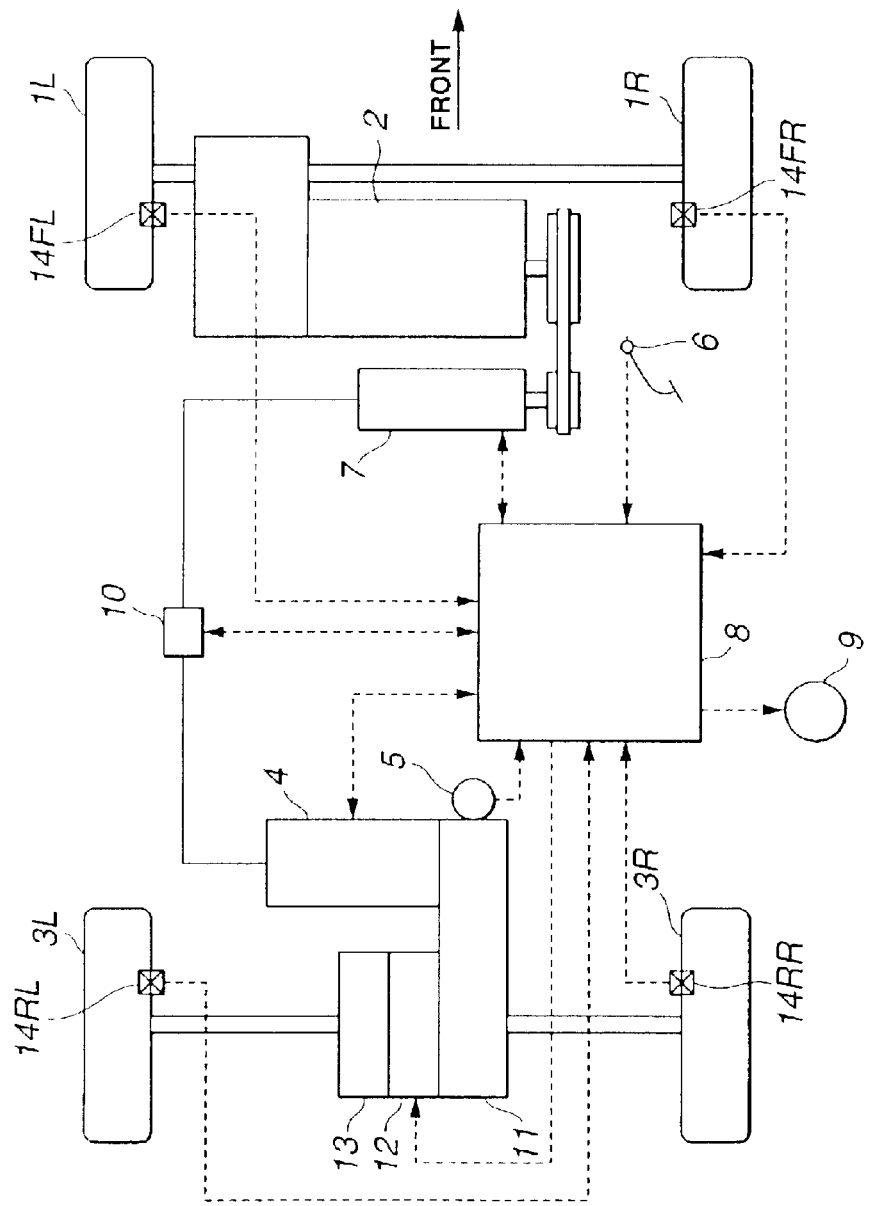
FIG. 1 is a block diagram of a hybrid type motor vehicle to which the present invention is practically applied.

Referring to FIG. 1, there is shown a block diagram of a hybrid motor vehicle to which the present invention is practically applied. More specifically, the hybrid motor vehicle shown in the drawing is of a 4-wheel drive type (viz., 4WD type) in which front road wheels are driven by an internal combustion engine and rear road wheels are driven by a direct current motor.

In FIG. 1, denoted by numerals 1L and 1R are front left and right road wheels. Denoted by numeral 2 is an internal combustion engine that drives the front left and right road wheels 1L and 1R, and denoted by numerals 3L and 3R are rear left and right road wheels which are driven by a direct current motor 4. Denoted by numeral 5 is a motor speed sensor that detects the rotation speed of direct current motor 4. Denoted by numeral 6 is an accelerator open degree sensor (AODS) that detects a depression degree of an accelerator pedal, and 7 is an electric generator (viz., dynamo), and 8 is a control unit that controls the 4-wheel drive system of the motor vehicle. The control unit 8 is a microcomputer that generally comprises a central processing unit (CPU), a random access memory (RAM), a read only memory (ROM) and input and output interfaces. Denoted by numeral 9 is an alarm lamp and 10 is a junction box (JB) that effects ON/OFF operation to a drive current fed to direct current motor 4 from dynamo 7. Denoted by numeral 11 is a speed reduction gear, 12 is a wet-type multiple disc clutch and 13 is a differential gear. Disc clutch 12 may be of an electromagnetic type. In this type, upon energization, drive and driven members of clutch 12 are engaged with each other and upon deenergization, the drive and driven members are disengaged from each other. The drive member is connected to an output part of speed reduction gear 11 and the driven member is connected to an input part of differential gear 13.

Denoted by numerals 14FL, 14FR, 14RL and 14RR are road wheel speed sensors (RWSS) that detect rotation speed of front left, front right, rear left and rear right road wheels 1L, 1R, 3L and 3R respectively. Alarm lamp 9 is provided in front of a driver's seat and controlled by control unit 8. In the illustration, motor speed sensor (MSS) 5 is mounted on speed reduction gear 11. However, if desired, the sensor 5 may be directly connected to direct current motor 4.

Internal combustion engine 2 is arranged to drive dynamo 7 as well as front left and right road wheels 1L and 1R. While, direct current motor 4 is arranged to drive rear left and right road wheels 3L and 3R. That is, a drive force produced by the motor 4 is transmitted to the rear wheels 3L and 3R through speed reduction gear 11, multiple disc clutch 12 and differential gear 13, as shown. Multiple disc clutch 12 functions to close/open the connection between speed reduction gear 11 and differential gear 13. Thus, when multiple disc clutch 12 assumes its OFF position, the drive force of direct current motor 4 is not transmitted to rear road wheels 3L and 3R.

Figure 2:
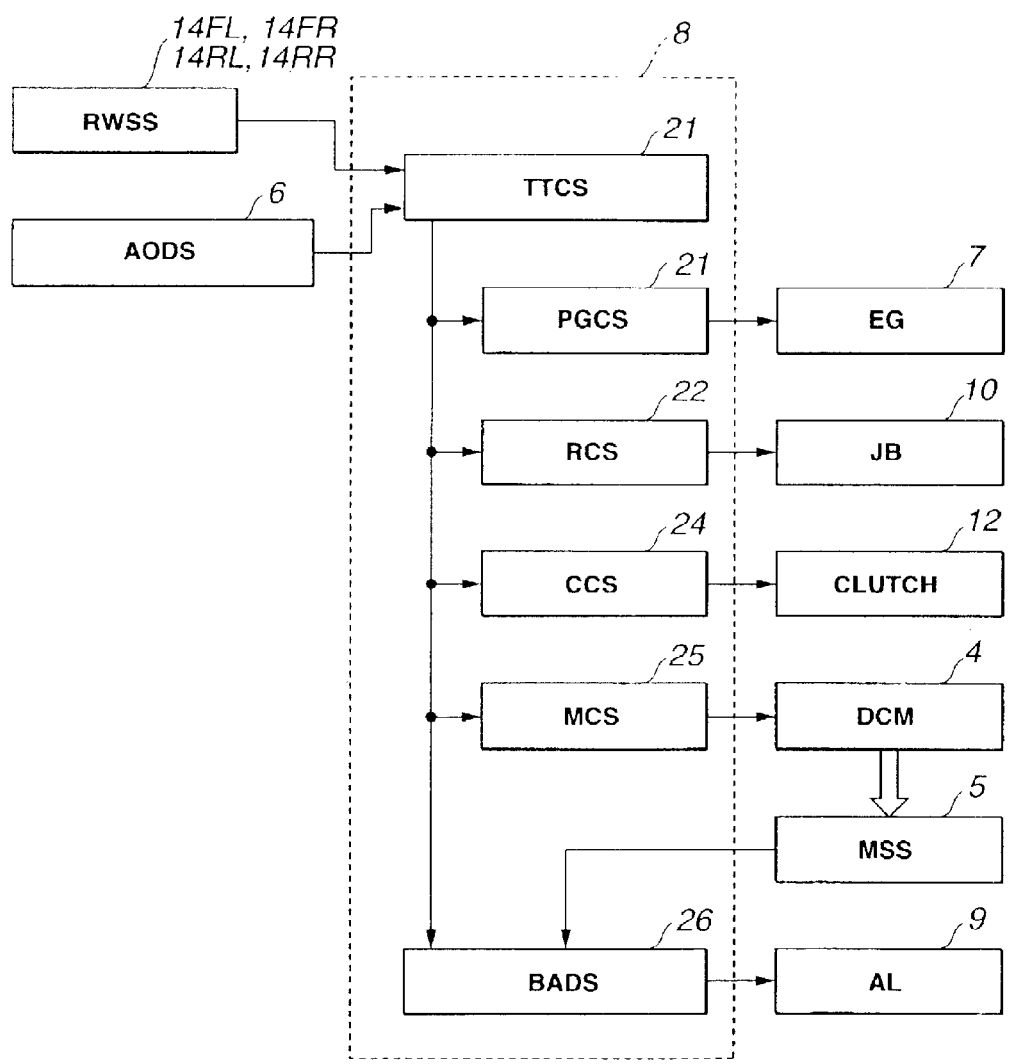
FIG. 2 is a block diagram of a motor drive control system employed in the hybrid type motor vehicle, which is a first embodiment of the present invention.

Referring to FIG. 2, there is shown a block diagram of a motor drive control system employed in the hybrid type motor vehicle, in which a first embodiment 100 of the present invention is provided.

As is seen from this drawing, control unit 8 generally comprises a target torque control section (TTCS) 21, a power generation control section (GCS) 22, a relay control section (RCS) 23, a clutch control section (CCS) 24, a motor control section (MCS) 25 and a brush abrasion detecting section (BADS) 26.

As shown, information signals from road wheel speed sensors (RWSS) 14FL, 14FR, 14RL and 14RR and accelerator open degree sensor (AODS) 6 are fed to target torque control section (TTCS) 21. By processing such information signals, target torque control section (TTCS) 21 feds suitable instruction signals to generation control section (GCS) 22, relay control section (RCS) 23, clutch control section (CCS) 24, motor control section (MCS) 25 and brush abrasion detecting section (BADS) 26, as shown. Upon receiving instruction signals, generation control section (GCS) 22 controls electric generator (dynamo) 7, relay control section (RCS) 23 controls junction box (JB) 10, clutch control section (CCS) controls multiple disc clutch 12, and motor control section (MCS) 25 controls direct current motor (DCM) 4. As shown, rotation speed of direct current motor (DCM) 4 is detected by motor speed sensor (MSS) 5. Upon receiving instruction signals from target torque control section (TTCS) 21 and motor speed sensor (MSS) 5, brush abrasion detecting section (BADS) 26 feeds alarm lamp 9 with an instruction signal.

That is, based on a vehicle condition detected by road wheel speed sensors 14FL, 14FR, 14RL and 14RR and accelerator open degree sensor 6, target torque control section 21 calculates a target torque needed for driving rear road wheels 3L and 3R. In accordance with the target torque thus calculated by the control section 21, generation control section 22 controls electric generator (dynamo) 7, relay control section 23 makes an ON/OFF control of a relay in junction box 10, clutch control section 24 makes an ON/OFF control of multiple disc clutch 12 and motor control section 25 makes a field current control of direct current motor 4.

When the value calculated by target torque control section 21 for driving rear road wheels 3L and 3R is 0 (zero), that is, when the vehicle is under 2WD condition, the relay in junction box 10 is controlled to keep OFF condition, multiple disc clutch 12 is controlled to keep OFF condition and the field current of direct current motor 4 is controlled to be 0 (zero).

Upon receiving an information signal from motor speed sensor 5 that represents rotation speed of direct current motor 4, brush abrasion detecting section 26 detects abrasion degree of the brush of the motor 4 with respect to a rotation speed that is provided when multiple disc clutch 12 is OFF, that is, when the driving force of the motor 4 does not reach the rear road wheels 3L and 3R. When the abrasion of the brush shows a predetermined degree, the abrasion detecting section 26 causes alarm lamp 9 to light letting the driver know a marked abrasion of the brush.

Due to the nature of viscous oil used in the wet-type multiple disc clutch 12, a certain torque transmission takes place between drive and driven members of the clutch 12 even when the clutch 12 assumes OFF condition. Accordingly, when direct current motor 4 is under OFF condition or kept deenergized, a certain torque is transmitted from rear road wheels 3L and 3R to the motor 4 through differential gear 13, the OFF clutch 12 and speed reduction gear 11. When, under this condition, brush is in its normal condition, the motor 4, viz., a rotator thereof is suppressed from rotation due to a certain friction force applied from brush to a commutator 33 (see FIG. 3). However, if, under such condition, brush is kept worn down by a certain degree, the rotator of the motor 4 is forced to rotate because of reduction of the friction force applied to commutator 33 from brush. Thus, by sensing such rotation of the rotor of the motor 4 at the time when clutch 12 is OFF, abrasion of the brush can be detected.

The above explanation will be much clarified from the following description.

Figure 3:
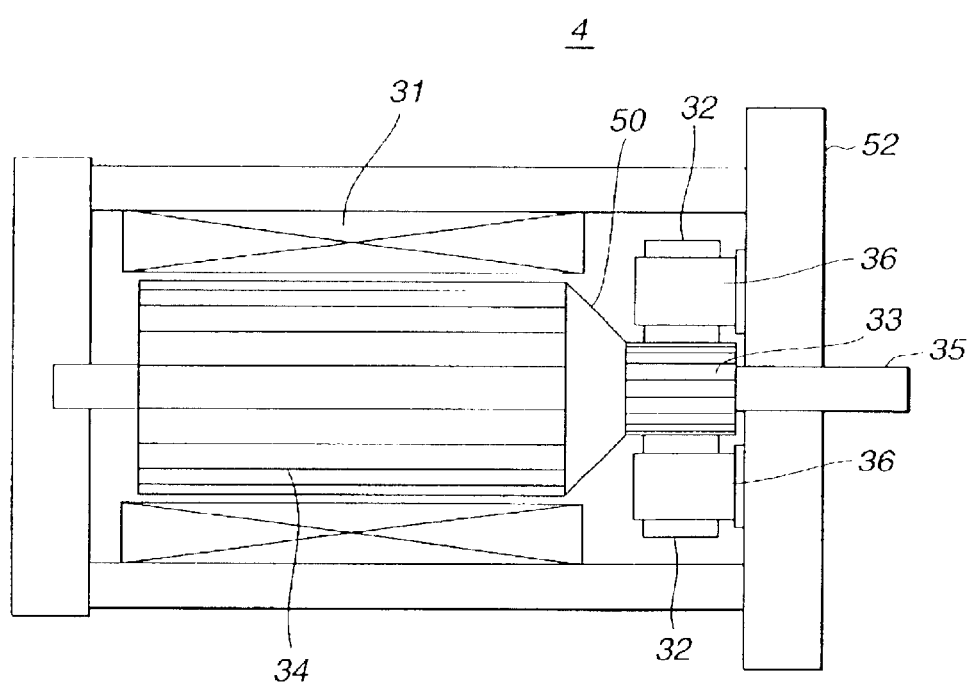
FIG. 3 is a sectional view of a direct current motor employed in the hybrid type motor vehicle.

FIG. 3 shows a sectional view of direct current motor 4. The motor 4 shown generally comprises a rotor 50 that is rotatably held in a housing 52. Within housing 52, there is installed a field coil 31. Rotor 50 has an armature coil 34 concentrically mounted thereon and an output shaft 35 projected axially from housing 52. The commutator 33 is coaxially disposed on a junction portion between rotor 50 and output shaft 35. Brushes 32 are held by respective brush holders 36 in such a manner that leading ends thereof contact commutator 33. Although not shown in this drawing, spring members are used for biasing brushes 32 against commutator 33. Under operation, brushes 32 and commutator 33 function to feed the armature coil 34 with a rectified current. Due to interaction between a magnetic field produced by the field coil 31 and a magnetic force produced by armature coil 34, rotor 50 is forced to rotate together with output shaft 35. Output shaft 35 is connected to an input member of speed reduction gear 11.

As is known, in direct current motor 4, friction forces are mainly caused by a frictional contact between brushes 32 and commutator 33 and that between bearings (not shown) and output shaft 35. However, it has been revealed that the friction force generated between brushes 32 and commutator 33 is much larger than that between bearings and output shaft 35.

For clarifying the present invention, the following description will be made with the aid of FIGS. 4A and 4B. In the drawings, FIG. 4A shows a condition wherein brush 32 is in its normal condition, that is, brush 32 is not worn down so large, while FIG. 4B shows a condition wherein brush 32 is in its abnormal condition, that is, brush 32 is worn down severely to a critical limit.

As shown, each brush 32 is slidably held by the corresponding brush holder 36, and a brush spring 37 is incorporated with brush 32 to bias the same against commutator 33. A lead wire 38 is connected to brush 32, so that under operation, current flows through brush 32, commutator 33 and armature coil 34 (see FIG. 3).

Figure 4A:
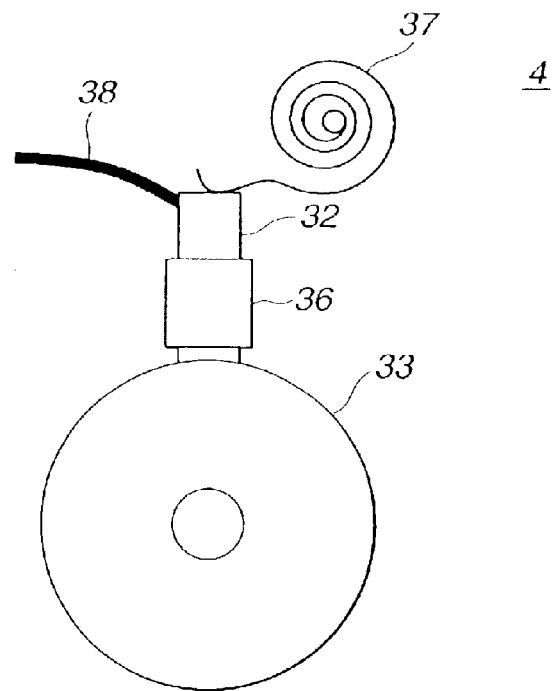
FIGS. 4A and 4B are schematic illustrations respectively showing normal and abnormal states of a brush of the direct current motor.
Figure 4B:
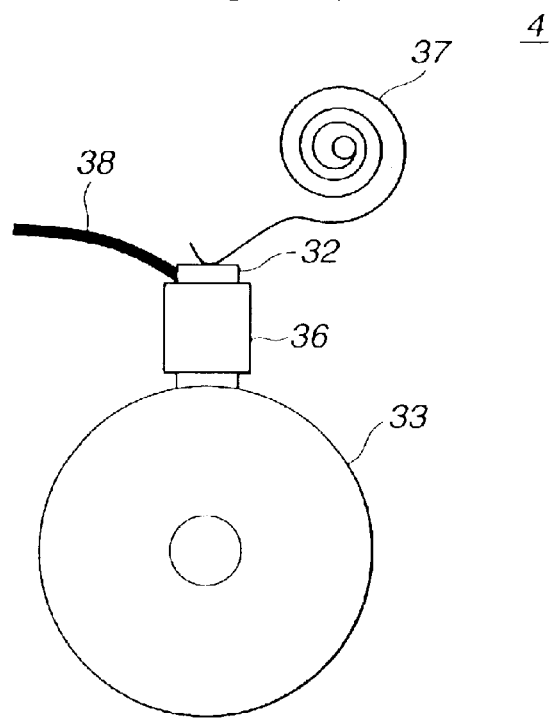

As is seen from FIG. 4A, when brush 32 is in its normal condition, brush spring 37 and lead wire 38 are in their normal positions, so that brush 32 is normally pressed against commutator 33 by brush spring 37. With increase of operating time of the motor 4, the length of brush 32 becomes shorter due to abrasion of the same, which induces a gradual expansion of a leading part of brush spring 37. While, when, as is seen from FIG. 4B, the abrasion of brush 32 comes to the critical limit, lead wire 38 or the leading part of brush spring 37 is brought into abutment with brush holder 36. In the illustrated example, lead wire 38 is brought into abutment with brush holder 36. Upon this, the biasing force by which brush 32 abuts against commutator 33 is suddenly reduced.

That is, before reaching the critical limit, brush 32 is permitted to contact commutator 33 with an allowable contact force that is produced by brush spring 37. However, once the abrasion of brush 32 comes to the critical limit, the contract force is suddenly reduced thereby suddenly reducing the contact resistance between brush 32 and commutator 33. Upon this, the output of direct current motor 4 is reduced. Accordingly, when brushes 32 are worn down greatly, the drive performance of the associated vehicle on 4WD mode is greatly lowered.

Figure 5:
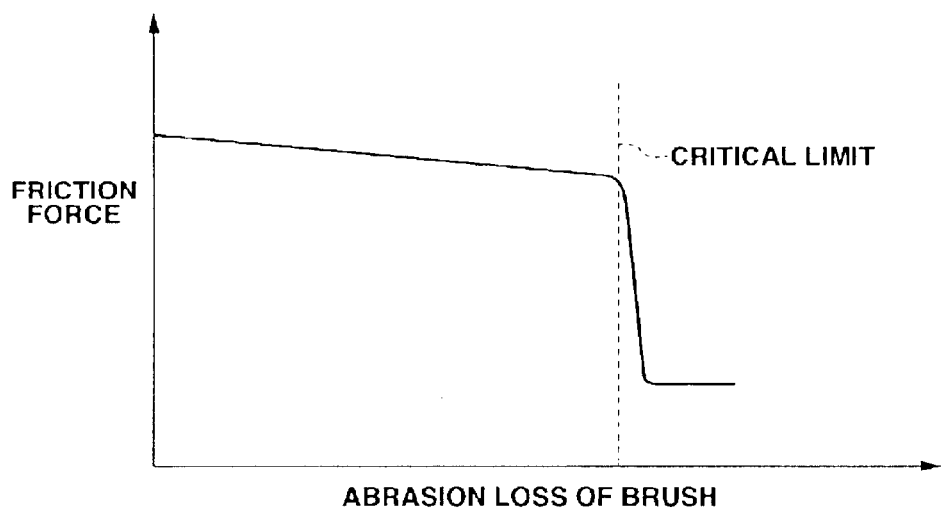
FIG. 5 is a graph showing a relationship between a friction of the direct current motor and abrasion loss of the brush of the motor.

Referring to FIG. 5, there is shown a graph that depicts a relationship between the friction force applied from brush 32 to commutator 33 and the abrasion loss of brush 32. As is seen from this graph, before reaching the critical limit, the friction force is gradually reduced with increase of abrasion loss of brush 32. This is because of the gradual expansion of the leading end of brush spring 37 from the center of the spring 37. While, when the abrasion reaches the critical limit, the contact force is suddenly reduced and the friction force is suddenly reduced. This is because the friction generated in the motor 4 is mainly caused by the friction force between brushes 32 and commutator 33.

When, as is described hereinabove, the drive torque calculated by control unit 8 for the rear road wheels 3L and 3R is 0 (zero), that is, when the vehicle is under 2WD mode, energization of direct current motor 4 is suppressed and clutch 12 is made OFF. As is described hereinabove, due the nature of the wet-type, the clutch 12 is permitted to carry out a certain torque transmission between drive and driven members thereof even when the same assumes OFF condition. When the vehicle is under 2WD mode, rotation of rear road wheels 3L and 3R forces a certain but small torque to be transmitted to the OFF-conditioned motor 4 through the OFF-conditioned clutch 12.

It is now to be noted that when bushes 32 are in their normal condition, that is, when they are not worn down so severely, the friction generated in the OFF-conditioned motor 4 is greater than the torque applied to the motor 4 from rear road wheels 3L and 3R. Thus, under such condition, rotor 50 of motor 4 is suppressed from rotation.

Figure 6:
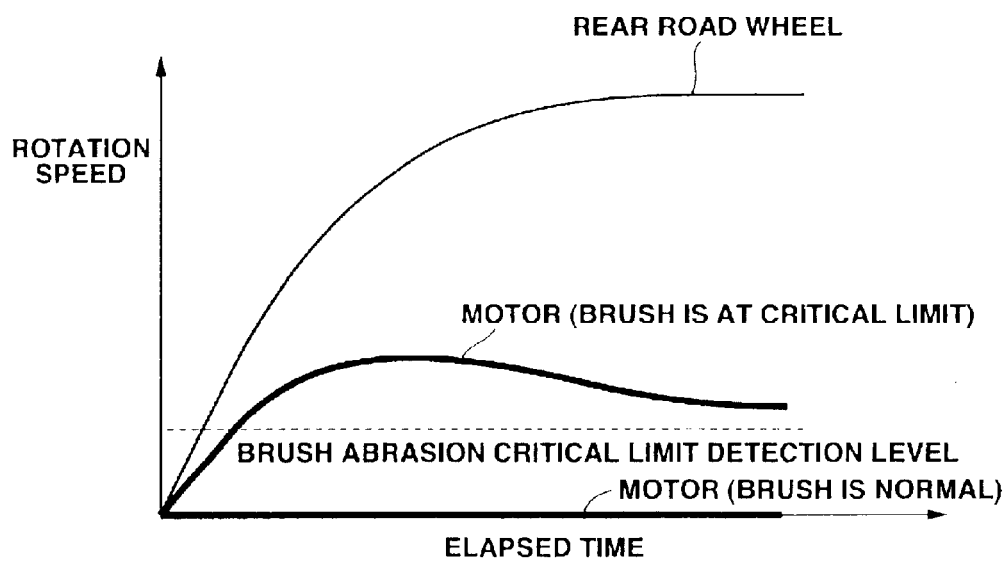
FIG. 6 is a graph showing rotation speed (rpm) of the direct current motor and that of a road wheel with respect to an elapsed time.

FIG. 6 is a graph depicting a relationship between the rotation speed (rpm) of the OFF-conditioned motor 4 and rear road wheels 3L and 3R with respect to an elapsed time. As is seen from this graph, when brushes 32 are normal, rotation speed of the OFF-conditioned motor 4 is kept 0 (zero) even when the speed of road wheels 3L and 3R increases. While, when, due to severe abrasion of brushes 32, the friction force generated in the motor 4 is suddenly reduced (see FIG. 5), rotor 50 of the motor 4 is forced to rotate.

In the present invention, the above-mentioned phenomena are practically used. That is, when, upon the vehicle assuming 2WD condition, the rotation speed of the OFF-conditioned motor 4 is detected higher than a predetermined level, it is judged that brushes 32 have been worn down to a critical level. The judgment is carried out by brush abrasion detecting section (BADS) 26 (see FIG. 2) of control unit 8 and alarm lamp 9 is energized to let the driver know the abnormal abrasion of brushes 32. Thus, the drive can realize the time when change of brushes 32 is needed.

Figure 7:
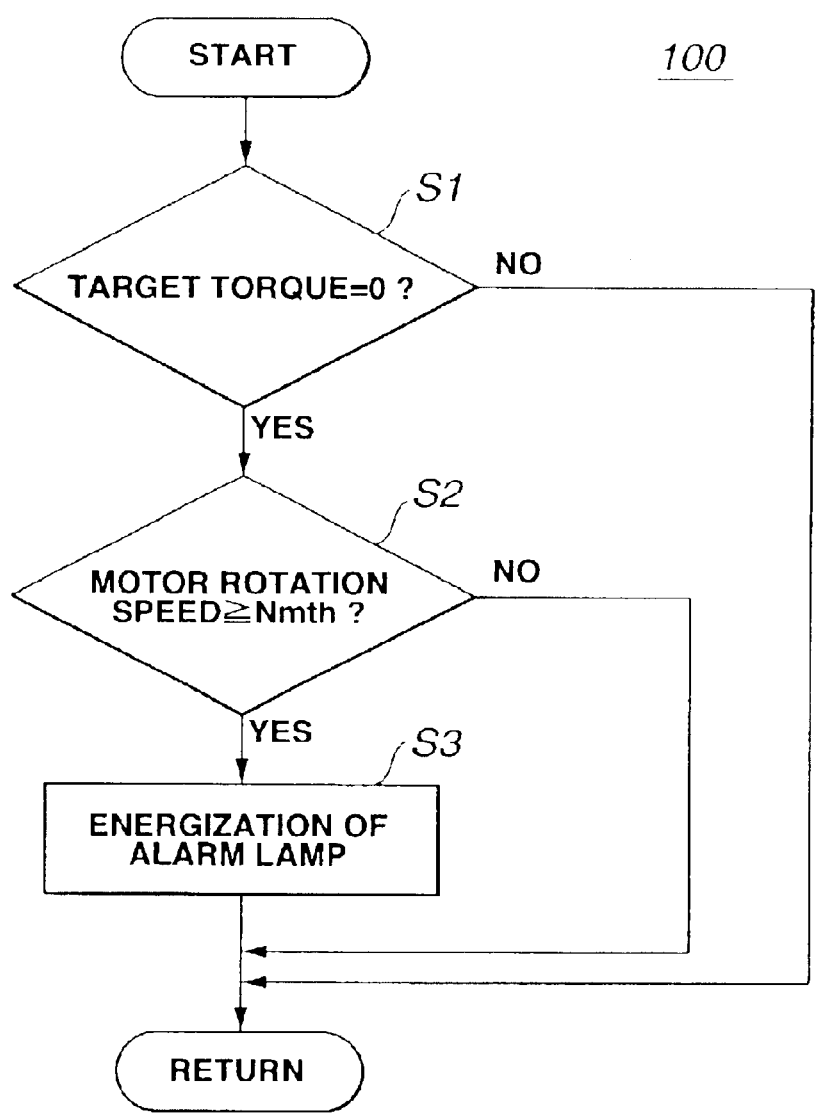
FIG. 7 is a flowchart showing programmed operation steps executed by a control unit of the first embodiment for detecting the abrasion of the brush.

FIG. 7 is a flowchart showing programmed operation steps executed by brush abrasion detecting section (BADS) 26 of control unit 8. The operation steps are carried out every 10 ms. As is seen from FIG. 2, instruction signal is fed to the detecting section 26 from target torque control section (TTCS) 21.

Referring back to FIG. 7, at step S1, judgment is carried out as to whether the target torque is equal to 0 (zero) or not, that is, the associated motor vehicle is in 2WD condition or not. That is, when a condition wherein the target torque is 0 (zero) is kept for a given time (viz., several seconds to ten seconds), YES answer is issued. This is because as follows. That is, just after the time when the target torque changes to 0 (zero), that is, just after the time the vehicle changes its mode from 4WD to 2WD, the rotor 50 of the motor 4 is still rotated due to its inertia.

If YES at step S1, that is, when the vehicle is judged to be under 2WD condition, the operation flow goes to step S2. At this step S2, judgment is carried out as to whether or not the rotation speed of the motor 4 (viz., rotor 50 of the same) is greater than or equal to a predetermined value Nmth. The predetermined value Nmth corresponds to "BRUSH ABRASION CRITICAL LIMIT DETECTION LEVEL" of FIG. 6. If YES, that is, when the rotation speed of the motor 4 is greater than or equal to the predetermined value Nmth, the operation flow goes to step S3 to energize alarm lamp 9. With this, the drive notes abnormal abrasion of brushes 32. If NO at step S1, that is, when the vehicle is judged to be a condition other than 2WD, the operation flow returns. Furthermore, If NO at step S2, that is, when the rotation speed of the motor 4 is smaller than the predetermined value Nmth, the operation flow returns judging that the abrasion of brushes 32 is not so severe.

If desired, in place of the alarm lamp 9, a blinking lamp and a buzzer may be used. Furthermore, if desired, a measure may be employed for suppressing the vehicle from assuming 4WD mode once such alarm is issued. In this modification, the target torque control section 21 of control unit 8 is arranged to constantly feed brush abrasion detecting section 26 with the instruction signal of target torque of 0 (zero).

Figure 8:
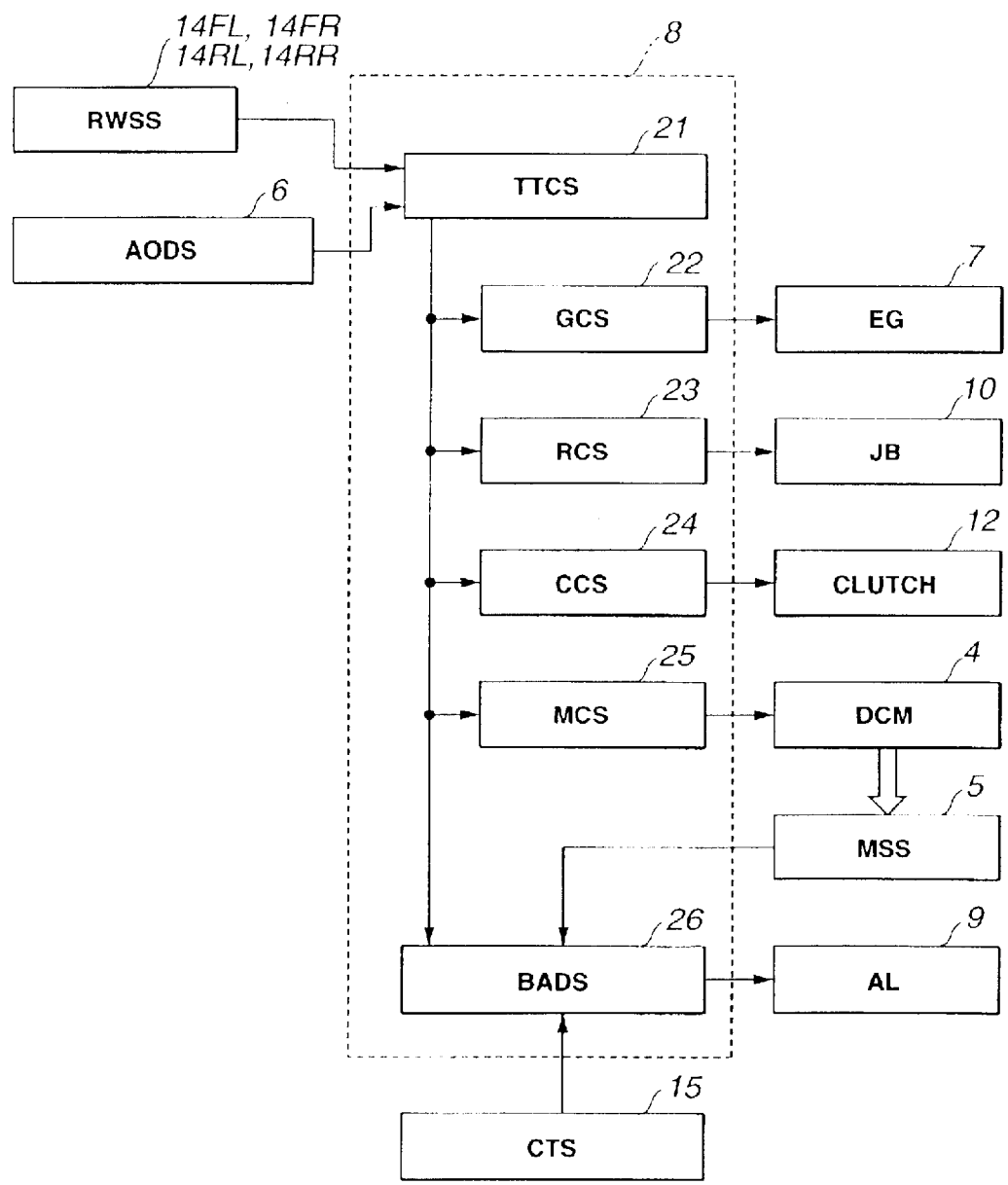
FIG. 8 is a block diagram similar to that of FIG. 2, but showing a motor drive control system in which a second embodiment of the present invention is provided.

Referring to FIG. 8, there is shown a block diagram of a motor drive control system employed in the hybrid type motor vehicle, in which a second embodiment 200 of the present invention is provided.

As is seen from this drawing, this second embodiment 200 is substantially the same as the above-mentioned first embodiment 100 (see FIG. 2) except that in second embodiment 200, a clutch temperature sensor 15 is further added. That is, in second embodiment 200, when the temperature of clutch 12 is lower than a predetermined level, the brush abrasion detection by brush abrasion detecting section (BADS) 26 is not carried out. The second embodiment 200 will be clarified from the following description.

Figure 9:
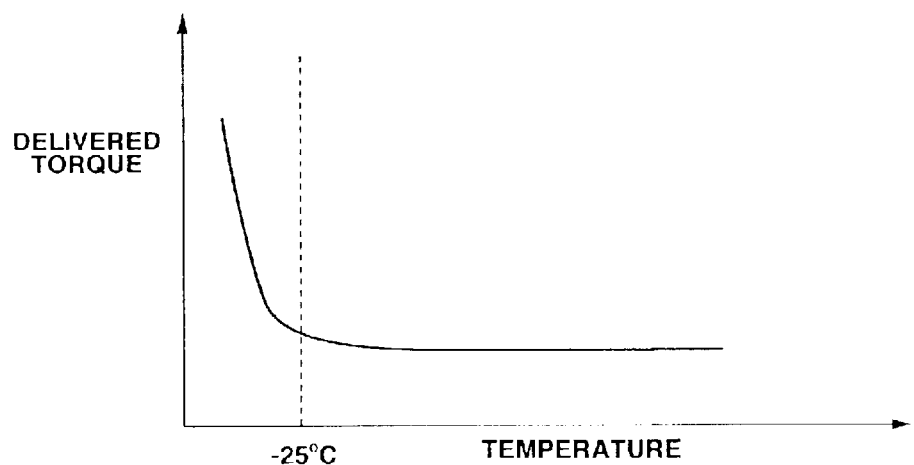
FIG. 9 is a graph showing a relationship between a temperature and a delivered torque at the time when a wet-type multiple disc clutch is switched OFF.

FIG. 9 is a graph showing a relationship between the temperature of clutch 12 and the delivered torque under a condition wherein the wet type clutch 12 is OFF.

As is seen from this graph, when the temperature lowers, the viscosity of oil in clutch 12 becomes high and thus the delivered torque provided by the OFF-conditioned clutch 12 increases. As seen from the graph, in general, when the temperature becomes lower than $-25°$ C., the viscosity of oil sharply increases and thus the delivered torque provided by the OFF-conditioned clutch 12 is sharply increased. Thus, if the above-mentioned brush detecting operation is carried out under such very cold condition, the high viscousness of the oil of the OFF-conditioned clutch 12 tends to cause brush abrasion detecting section (BADS) 26 to issue an erroneous instruction to alarm lamp 9. That is, even when the vehicle is under 2WD mode, the high viscousness of the oil forces the rotor 50 of the motor 4 to rotate at a certain speed. Upon sensing such rotation, brush abrasion detecting section 26 issues the abnormal brush abrasion signal erroneously. Accordingly, in second embodiment 200, when the temperature of the OFF-conditioned clutch 12 is lower than a predetermined level (for example, $-25°$ C.), the brush abrasion detection by brush abrasion detecting section 26 is not carried out.

Figure 10:
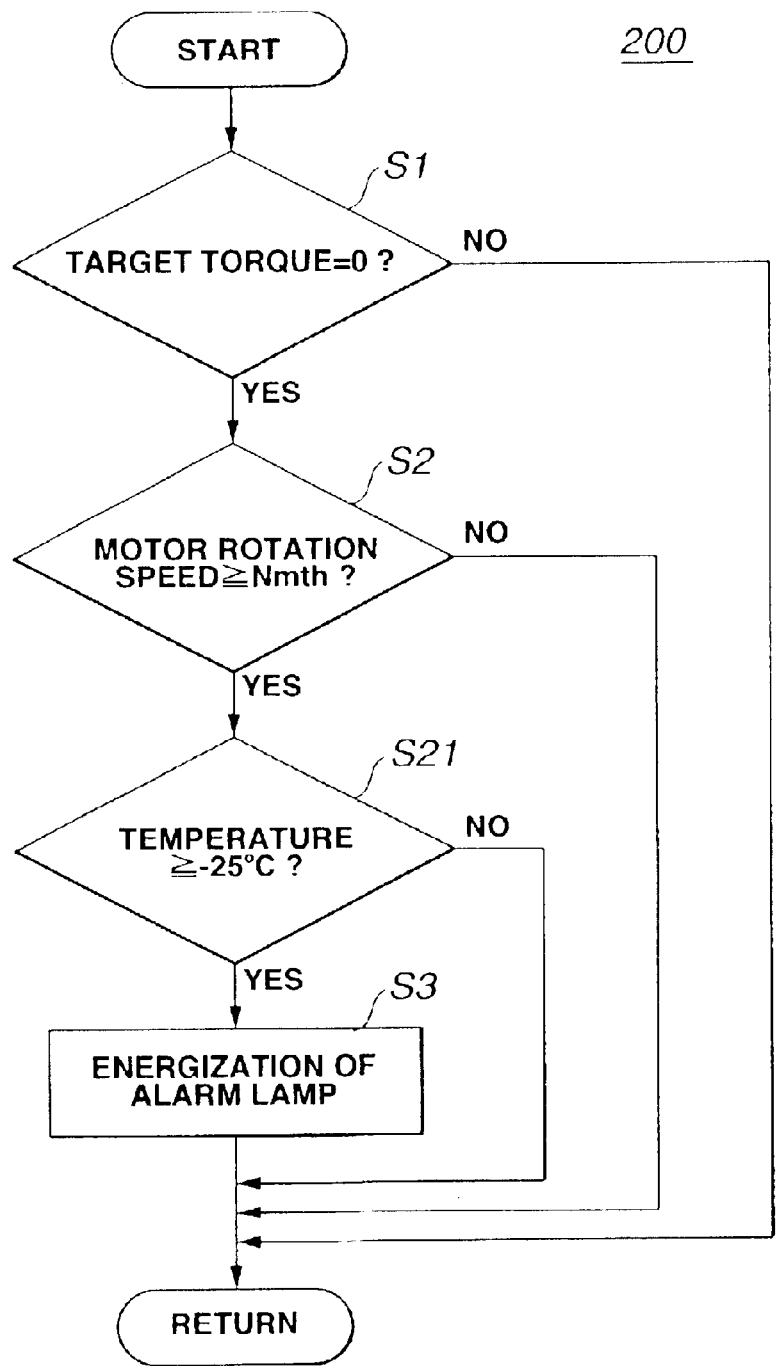
FIG. 10 is a flowchart showing programmed operation steps executed by a control unit of the second embodiment for detecting the abrasion of the brush.

Referring to FIG. 10, there is shown a flowchart that shows programmed operation steps executed by control unit 8 employed in second embodiment 200. As is seen from the drawing, the flowchart is substantially the same as that of first embodiment 100 except that in second embodiment 200, a judgment step S21 is added. That is, once the operation flow comes to step S21 from step S2, judgment is carried out as to whether or not the temperature of clutch 12 is higher than or equal to $-25°$ C. If YES, that is, when the temperature of clutch 12 is higher than or equal to $-25°$ C., the operation flow goes to step S3 to make energization of alarm lamp 9. While, if NO, that is, when the temperature is lower than $-25°$ C., the operation flow returns bypassing step S3.

In the following, a third embodiment 300 of the present invention will be described with reference to FIGS. 11 and 12.

In this embodiment 300, in place of the clutch temperature sensor 15 that directly detects the temperature of clutch 12, a travel distance detecting section is provided in control unit 8. That is, in this embodiment 300, an assumption is so made that once the vehicle runs by a predetermined distance from the last stopping (or the time when the engine started), the temperature of the OFF-conditioned clutch 12 is increased. The predetermined distance is referred to a travel distance in the following description.

Figure 11:
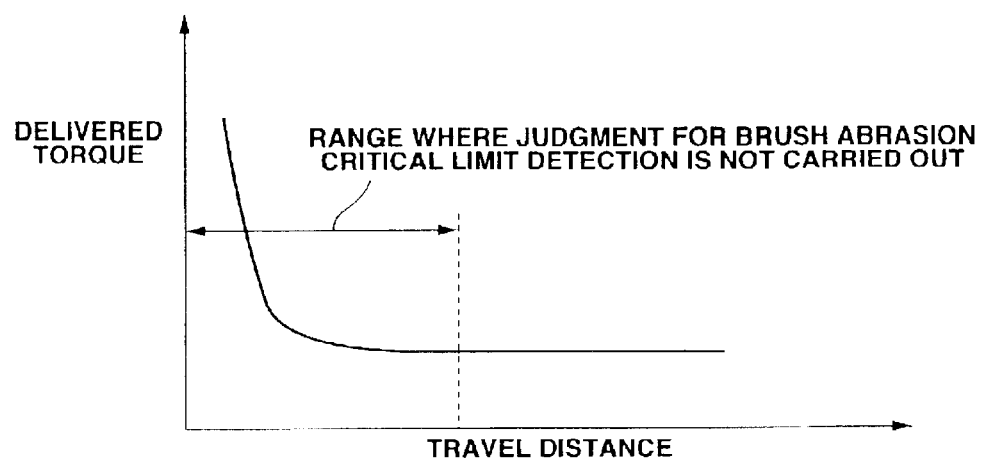
FIG. 11 is a graph showing a relationship between a travel distance of the vehicle and the delivered toque at the time when the clutch is switched OFF.

FIG. 11 is a graph showing a relationship between a travel distance of the vehicle and a delivered torque provided by the OFF-condition clutch 12. As is seen from this graph, even if the ODD-conditioned clutch 12 is too cooled (for example, $-30°$ C.), movement of the vehicle increases the temperature of oil of clutch 12 because the oil is stirred, which lowers the viscosity of the oil and thus reduces the delivered torque. Although depending on the size of clutch 12 and the type of oil contained therein, it has been revealed that the travel distance of about several hundred meters induces a sufficient reduction of the delivered torque. Thus, in third embodiment 300, until the vehicle does not show the travel distance of the several hundred meters, the brush abrasion detection by brush abrasion detecting section 26 is not carried out.

Figure 12:
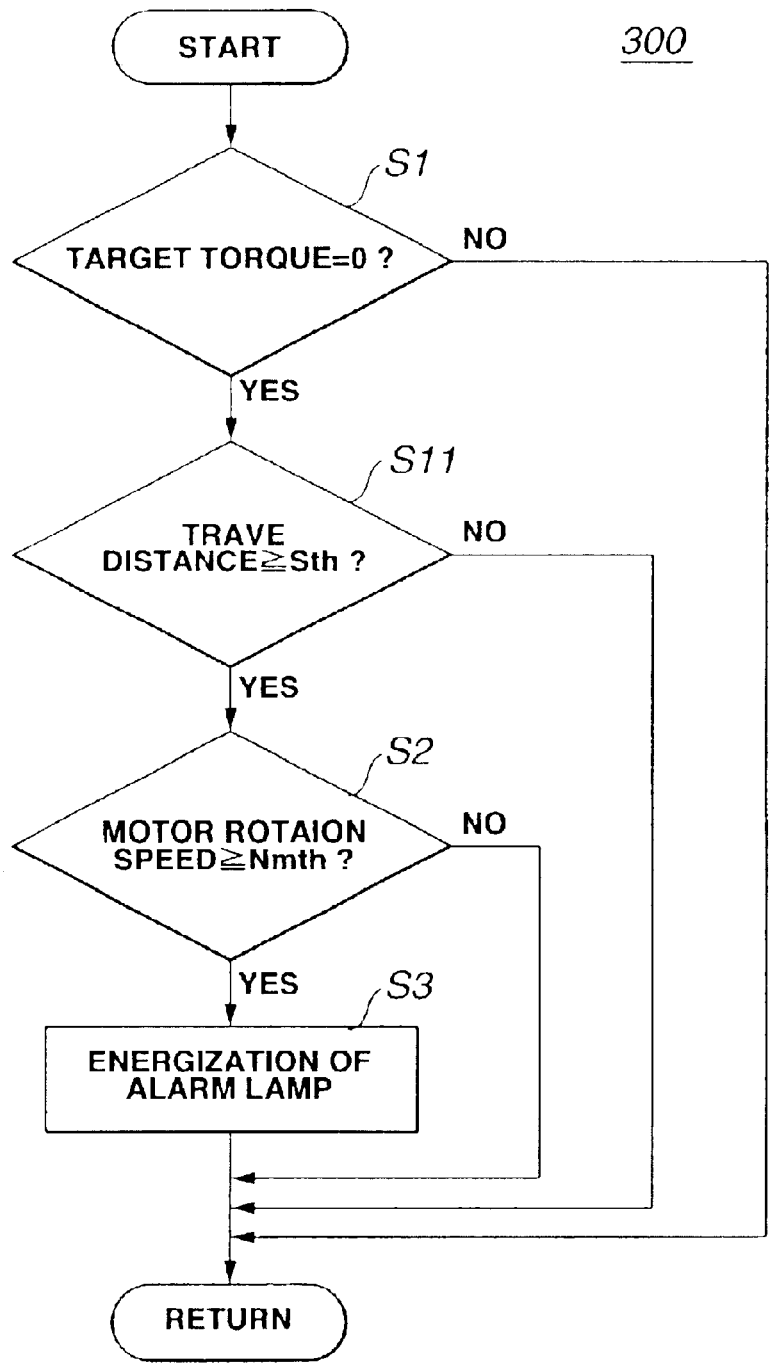
FIG. 12 is a flowchart similar to that of FIG. 7, but showing programmed operation steps executed by a control unit employed in a third embodiment of the present invention.

Referring to FIG. 12, there is shown a flowchart that shows programmed operation steps executed by control unit 8 employed in third embodiment 300. As is understood from the drawing, the flowchart is substantially the same as that of first embodiment 100 except that in third embodiment 300, a judgment step S11 is added. That is, once the operation flow comes to step S11 from step S1, judgment is carried out as to whether or not the travel distance is greater than or equal to a predetermined value Sth. If YES, that is, when the travel distance is greater than or equal to the predetermined value Sth, operation flow goes to step S2. While, if NO, that is, when the travel distance is smaller than the predetermined value Sth, the operation flow returns bypassing steps S2 and S3. It is to be noted that the predetermined value Sth is set about several hundred meters when about $-25°$ C. is expected by clutch 12.

For the reasons as is described hereinabove, in third embodiment 300, there is no need of preparation of clutch temperature sensor 15 that is used in second embodiment 200.

Thus, in third embodiment 300, the brush abrasion detection is not carried out until the vehicle runs by the predetermined travel distance. If desired, control unit 8 may be so arranged as to memorize the result of a pervious running of the vehicle. In this case, if a brush abrasion critical limit has been judged in the previous running, energization of alarm lamp 9 is expected before the vehicle fulfills the predetermined travel distance.

In the above-mentioned embodiments 100, 200 and 300, based on information signals from road wheel speed sensors 14FL, 14FR, 14RL and 14RR and accelerator open degree sensor 6, control unit 8 calculates a torque needed by rear road wheels 3L and 3R, and in accordance with the target torque thus calculated, control unit 8 controls dynamo 7, the relay in junction box 10, disc clutch 12 and direct current motor 4. However, if a measure is employed wherein direct current motor 4 drives the road wheels and a means for detecting the rotation speed of the motor 4 is provided, the present invention can be applied to other type 4WD system. That is, if the motor 4 is arranged to be powered by a battery through a chopper circuit, the present invention is embodied as long as the motor 4 drives the road wheels through clutch 12. Furthermore, in place of the above-mentioned electromagnetic wet-type multiple disc clutch 12, other type clutch may be employed as long as it can make a certain torque transmission between drive and driven members of the same in its OFF condition.

The entire contents of Japanese Patent Application 2002-001259 (filed Jan. 8, 2002) are incorporated herein by reference.

Although the invention has been described above with reference to the embodiments of the invention, the invention is not limited to such embodiments as described above. Various modifications and variations of such embodiments may be carried out by those skilled in the art, in light of the above description.

What is claimed is:

1. In a motor vehicle having a road wheel driven by a direct current motor that has a brush installed therein, a system for detecting abrasion of the brush comprising:
   a clutch arranged between the road wheel and the direct current motor, the clutch being of a wet type so that in ON condition drive and driven members thereof are engaged with each other causing transmission of a torque of the motor to the road wheel and in OFF condition the drive and driven members thereof are disengaged from each other permitting a certain transmission of a torque of the road wheel toward the motor due to a viscosity possessed by oil in the clutch;
   a rotation speed sensor that detects a rotation speed of the motor; and
   a control unit that issues a brush abrasion representing signal based on the rotation speed of the motor detected under OFF condition of the clutch.

2. A system as claimed in claim 1, in which the control unit is configured to carry out:
   judging that the brush has been worn down by a given degree when the rotation speed of the motor detected under the OFF-condition of the clutch is higher than a predetermined value.

3. A system as claimed in claim 1, in which the clutch is of an electromagnetic type wherein upon energization thereof the drive and driven members are engaged with each other and upon deenergization thereof the drive and driven members are disengaged from each other.

4. A system as claimed in claim 1, in which the drive member of the clutch is connected to an output part of the motor through a speed reduction gear and the driven member of the clutch is connected to the road wheel through a differential gear.

5. A system as claimed in claim 1, in which the control unit comprising:
   a target torque control section that calculates a target torque needed for driving the road wheel in accordance with a rotation speed of the road wheel and an accelerator pedal open degree; and
   a brush abrasion detecting section that issues the brush abrasion representing signal based on the target torque calculated by the target torque control section as well as the rotation speed of the motor detected under OFF condition of the clutch.

6. A system as claimed in claim 5, in which the control unit further comprising:
   a power generation control section that, based on the calculated target torque, controls a dynamo powered by an internal combustion engine that powers the vehicle;
   a relay control section that, based on the calculated target torque, controls a relay in a junction box;
   a clutch control section that, based on the calculated target torque, controls the clutch; and
   a motor control section that, based on the calculated target torque, controls the direct current motor.

7. A system as claimed in claim 1, in which the brush of the direct current motor has a leading end that abuts against a commutator of the motor, and in which the brush is biased against the commutator by a spring member.

8. A system as claimed in claim 7, further comprising a stopper member that stops a movement of the brush toward the commutator once the abrasion of the brush shows a predetermined degree.

9. A system as claimed in claim 1, further comprising a clutch temperature sensor that detects a temperature of the clutch, the control unit being configured to carry out an operation for issuing the brush abrasion representing signal only when the detected temperature of the clutch is higher than a predetermined value.

10. A system as claimed in claim 9, in which the predetermined value of the temperature of the clutch is −25° C.

11. A system as claimed in claim 1, further comprising a travel distance detecting section that is provided in the control unit for detecting a travel distance of the vehicle from the last stopping of the vehicle, the control unit being configured to carry out an operation for issuing the brush abrasion representing signal only when the travel distance detected by the travel distance detecting section is higher than a predetermined value that induces a certain increase in temperature of the clutch under OFF condition.

12. A system as claimed in claim 11, in which the predetermined value of the travel distance is several hundred meters.

13. A system as claimed in claim 1, further comprising an alarm device that issues a visual/acoustic alarm when the control unit issues the brush abrasion representing signal.

14. In a motor vehicle having a road wheel driven by a direct current motor that has a brush installed therein, a system for detecting abrasion of the brush comprising:
   clutch means arranged between the road wheel and the direct current motor, the clutch means being of a wet type so that in ON condition drive and driven members thereof are engaged with each other causing a transmission of a torque of the motor to the road wheel and in OFF condition the drive and driven members thereof are disengaged from each other permitting a certain transmission of a torque of the road wheel toward the motor due to a viscosity possessed by oil in the clutch;
   rotation speed sensor means that detects a rotation speed of the direct current motor; and
   control means that issues a brush abrasion representing signal based on the rotation speed of the motor detected under OFF condition of the clutch.

15. In a motor vehicle having a road wheel driven by a direct current motor with a brush installed therein and a clutch arranged between the road wheel and the direct current motor, the clutch being of a wet type so that in ON condition drive and driven members thereof are engaged with each other causing transmission of a torque of the motor to the road wheel and in OFF condition the drive and driven members thereof are disengaged from each other permitting a certain transmission of a torque of the road wheel toward the motor due to a viscosity possessed by oil in the clutch,
   method for detecting abrasion of the brush comprising:
   detecting a rotation speed of the motor; and
   issuing a brush abrasion representing signal based on the detected rotation speed of the motor under OFF condition of the clutch.

* * * * *